United States Patent [19]

Saito et al.

[11] Patent Number: 5,902,837

[45] Date of Patent: May 11, 1999

[54] PHOTO-CURING RESIN COMPOSITION COMPRISING A PROPENYL ETHER GROUP-CONTAINING COMPOUND

[75] Inventors: Takao Saito; Kohei Maeda; Naoshi Ozasa, all of Kyoto, Japan

[73] Assignee: Sanyo Chemical Industries, Ltd., Kyoto, Japan

[21] Appl. No.: 08/693,638

[22] Filed: Aug. 9, 1996

[30] Foreign Application Priority Data

| Aug. 9, 1995 | [JP] | Japan | 7-225695 |
| Dec. 25, 1995 | [JP] | Japan | 7-351791 |
| Apr. 24, 1996 | [JP] | Japan | 8-129028 |
| Apr. 24, 1996 | [JP] | Japan | 8-129029 |
| Apr. 26, 1996 | [JP] | Japan | 8-131290 |

[51] Int. Cl.$^6$ ............................. C08F 2/50; C08L 75/16
[52] U.S. Cl. .......................... 522/31; 522/90; 522/96; 522/98; 522/114; 522/120; 522/133; 522/141; 522/150; 522/162; 522/173; 522/176; 522/181
[58] Field of Search .............................. 522/31, 181, 96, 522/98, 90, 114, 120, 133, 141, 173, 176, 150, 162

[56] References Cited

U.S. PATENT DOCUMENTS

| 5,045,572 | 9/1991 | Plotkin et al. | 522/174 |
| 5,055,357 | 10/1991 | Plotkin et al. | 522/170 |
| 5,153,237 | 10/1992 | Plotkin et al. | 522/174 |
| 5,159,098 | 10/1992 | Plotkin et al. | 522/174 |
| 5,373,032 | 12/1994 | Miller et al. | 522/96 |
| 5,486,545 | 1/1996 | Crivello | 522/181 |
| 5,567,858 | 10/1996 | Crivello | 522/181 |

FOREIGN PATENT DOCUMENTS

| WO 89/06228 | 7/1989 | WIPO . |
| WO 89/08097 | 9/1989 | WIPO . |
| WO 89/10346 | 11/1989 | WIPO . |
| WO 90/03988 | 4/1990 | WIPO . |
| WO 90/13587 | 11/1990 | WIPO . |
| WO 91/13052 | 9/1991 | WIPO . |
| WO 92/04388 | 3/1992 | WIPO . |
| WO 94/04594 | 3/1994 | WIPO . |

OTHER PUBLICATIONS

Crivello et al., Propenyl Ethers. I. The Synthesis of Propenyl Ether Monomers, Journal of Polymer Science Part A: Polymer Chemistry, vol. 31, 1993, pp. 1473–1482.

Crivello et al., Propenyl Ethers. II. Study of the Photoinitiated Cationic Polymerization of Propenyl Ether Monomers, Journal of Polymer Science Part A: Polymer Chemistry, vol. 31, 1993, pp. 1483–1491.

Crivello et al., Synthesis, Characterization, and Properties of Novel Aromatic Bispropenyl Ethers, Journal of Polymer Science Part A: Polymer Chemistry, vol. 22, 1984, pp. 2105–2121.

*Primary Examiner*—Susan W. Berman
*Attorney, Agent, or Firm*—Pollock, Vande Sande & Amernick

[57] ABSTRACT

A photocurable resin composition comprising a propenyl ether group-containing compound (A) having propenyl ether groups of the following formula (1) and having a number-average molecular weight of not less than 500, and a cationic photopolymerization initiator (B).

$$CH_3-CH=CH-O- \qquad (1)$$

The object is to provide a photocurable resin composition which cures at a higher speed than a vinyl ether compound on exposure to light irradiation, and has improved flow characteristics, physical property of cured resin, and adhesion to metal.

28 Claims, No Drawings

PHOTO-CURING RESIN COMPOSITION COMPRISING A PROPENYL ETHER GROUP-CONTAINING COMPOUND

FIELD OF THE INVENTION

The present invention relates to a resin composition comprising a propenyl ether group-containing compound having a fast-curing property and a cured artefact available on curing of said resin composition. More particularly, the present invention relates to a resin composition which cures in a very short time upon exposure to irradiation of ultraviolet light, an electron beam or other actinic radiation and to a cured artefact available therefrom.

BACKGROUND OF THE INVENTION

Photocurable resin compositions have been used broadly as photosensitive resin materials for photoresists such as printed circuit board (PCB) resists and liquid crystal display (LCD) resists, etc., hard coatings, optical fiber coatings, optical disk coatings, paper coatings, wood coatings, paints, photosensitive lithographic plates, printing inks, adhesives, and other products. As such photocurable resin compositions, those based on acrylate resin represented by epoxy acrylate, urethane acrylate, etc., alicyclic epoxy resin, vinyl ether resin, etc. have already been commercially implemented.

However, acrylate resin is very poor in surface curability because of the oxygen-associated inhibition of polymerization at curing and in addition is so high in viscosity that it does not lend itself well to a high-speed UV-curing system. Alicyclic epoxy resin is free from the problem of said oxygen-associated inhibition of polymerization, but is very low in curing rate in a cationic photocuring system.

As a photosensitive resin composition improved in the above aspects, there is known a vinyl ether resin but its curing rate is not high enough for use in a high-speed curing system.

In Journal of Polymer Science, Part A, Polymer Chemistry, 31, 1473 (1993), Crivello et al. disclose a propenyl ether compound which cures faster than a vinyl ether compound upon exposure to light irradiation. However, this compound is highly volatile and not sufficiently fluid so that it is not fully satisfactory in industrial applications. Moreover, it is inadequate in hardness and adhesion to metal. Therefore, a demand exists for a high-speed-curing photosensitive resin composition capable of meeting industrial requirements.

SUMMARY OF THE INVENTION

Under the above-described state of the art, the present invention has for its object to provide a photocurable resin composition which cures at a higher speed than said vinyl ether compound on exposure to light irradiation, has improved flow characteristics, curability, and adhesion to metal, and can be produced at low cost.

The present invention provides a photocurable resin composition comprising a propenyl ether group-containing compound (A) having propenyl ether groups of the following formula (1) and having a number-average molecular weight of not less than 500, and a cationic photopolymerization initiator (B).

$$CH_3—CH=CH—O— \quad (1)$$

DETAILED DESCRIPTION OF THE INVENTION

The photocurable resin composition of the present invention comprises a propenyl ether group-containing compound (A) and a cationic photopolymerization initiator (B)

The propenyl ether group-containing compound (A) is first described in further detail below.

The propenyl ether group-containing compound (A) [hereinafter referred to briefly as compound (A)] for use in the present invention has propenyl ether groups of above mentioned formula (1) within its molecule. Preferably, compound (A) has at least five propenyl ether groups per molecule. The number of propenyl ether groups of five or greater makes the curing speed sufficiently high. More preferably, compound (A) contains at least ten propenyl ether groups.

The number-average molecular weight of compound (A) should be not less than 500. If the molecular weight is less than 500, the composition will be too low in viscosity and too fluid for successful formation of a film. Therefore, the above-mentioned range is essential. The preferred range is not less than 1000.

Although it is sufficient that said compound (A) be a compound containing propenyl ether groups and having a number-average molecular weight of not less than 500 as mentioned above, it preferably has a backbone chain selected from the group consisting of polyether, polyvinyl, polyester, polyurethane, polyamide, polycarbonate, and novolac chains.

In this connection, said compound (A) preferably has at least five propenyl ether groups in its side chains.

As examples of said compound (A) having any of the polyether, polyvinyl, polyester, polyurethane, polyamide, polycarbonate, and novolac backbone chains, the compounds having the structures represented by the following general formulas (2) to (10), respectively, can be typically mentioned.

(2)

(3)

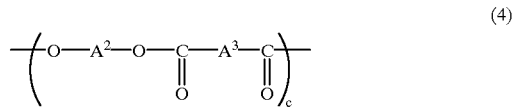
(4)

(5)

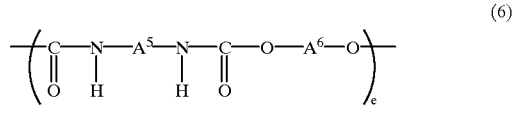
(6)

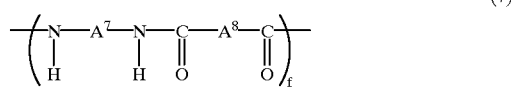
(7)

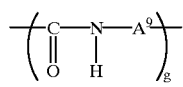  (8)

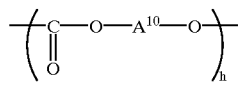  (9)

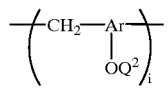  (10)

These structures are now described in detail.

The compound (A) having the structure of general formula (2) has a polyether backbone chain.

Referring to general formula (2), a represents an integer of 2 to 200. If the value of a is within said range, the viscosity of the compound will be good for efficient dissolution of cationic photopolymerization initiator (B) therein and the fluidity characteristic is suitable for the formation of a film. The preferred range of a is 2 to 80 and the still more preferred range is 5 to 10. $A^1$ represents an alkylene group which is substituted by -X-Z or unsubstituted, an arylene group, an aralkylene group, a haloalkylene group, or a residue available on ring-opening polymerization of glycidyl ether. Throughout this specification, -X-Z means a group of the formula -X-Z, wherein X represents a divalent organic group and Z represents a propenyl ether group of formula (1). Preferably, $A^1$ represents a group substituted by -X-Z in at least five of a occurrences in general formula (1).

Referring, further, to general formula (2), $A^1$ may be the same or different over a occurrences and the addition mode of ($A^1$—O)a may be random or block.

As examples of X, there can be mentioned hydrocarbon groups optionally containing at least one group selected from the group consisting of ether, carbonate, ester, imino, amido, urethane, urea, and sulfide groups, thus including —$CH_2$—, —$CH_2CH_2$—, —$CH_2OCH_2CH_2$—, —CHOC(=O)O$CH_2$—, —$CH_2$NHC$H_2CH_2$—, —$CH_2$NHC(=O)NH($CH_2$)$_6$NHC(=O)O—, and —$CH_2$S($CH_2$)$_2$C(=O)O($CH_2$)$_2$—, among others.

$A^1$ in general formula (2) specifically includes the group available on substitution of -X-Z for one hydrogen atom of an alkylene group such as methylene, ethylene, propylene, 1-butylene, 2-butylene, 1-methyltrimethylene, 2-methyltrimethylene, tetramethylene, methyltetramethylene, pentamethylene, pentylene, isoamylene, hexylene, cyclohexylene, neohexylene, heptylene, octylene, nonylene, decylene, undecylene, dodecylene, etc.; an alkylene group such as methylene, ethylene, propylene, 1-butylene, 2-butylene, 1-methyltrimethylene, 2-methyltrimethylene, tetramethylene, methyltetramethylene, pentamethylene, pentylene, isoamylene, hexylene, cyclohexylene, neohexylene, heptylene, octylene, nonylene, decylene, undecylene, dodecylene, etc.; an arylene group such as phenylene, naphthylene, anthrylene, phenanthrylene, etc.; an aralkylene group such as benzylene, 1-phenethylene, 2-phenethylene, 1-phenylpropylene, 2-phenylpropylene, 3-phenylpropylene, etc.; a haloalkylene group such as chloroethylene, dichloroethylene, bromoethylene, chloromethylethylene, etc.; and the residue available on ring-opening polymerization of a glycidyl ether such as butyl glycidyl ether, phenyl glycidyl ether, allyl glycidyl ether, 2-ethylhexyl glycidyl ether, cresyl glycidyl ether, p-sec-butylphenyl glycidyl ether, glycidyl methacrylate, diglycidyl ether, (poly)ethyleneglycol diglycidyl ether, (poly)propylene glycol diglycidyl ether, butanediol diglycidyl ether, diglycidylaniline, trimethylolpropane triglycidyl ether, glycerin triglycidyl ether, and so on. Preferred, among them, are alkylene groups of 2 to 6 carbon atoms. Still more preferred are ethylene and propylene. The greater the length of the alkylene chain is, the less easily soluble is the cationic photopolymerization initiator. (B).

As more specific examples of compound (A) having the structure of general formula (2), compounds of the following general formula (12) can be mentioned.

$$R^3[-O-(A^1-O)a-R^4]m_1 \quad (12)$$

wherein $R^3$ represents a residue available on elimination of $m_1$ hydroxyl groups from a polyhydric alcohol or polyphenol compound; $R^4$ represents propenyl, hydrogen, alkyl, acyl, (meth)acryloyl, or aryl; $R^4$ is propenyl in at least two of $m_1$ occurrences; $m_1$ represents an integer of 2 to 200.

The polyhydric alcohol mentioned above includes glycerin, polyglycerol (di- to octadecamers, e.g. diglycerin, triglycerin, tetraglycerin, etc.), ring-opening polymerization products of glycidol (compounds with degrees of polymerization=2 to 200), trimethylolalkanes (e.g. trimethylolethane, trimethylolpropane, trimethylolbutane, etc.) and di- and trimers thereof; polyols such as monopentaerythritol, dipentaerythritol, 1,3,5-pentaerythritol, sorbitol, sorbitan, sorbitan-glycerin condensate, adonitol, arabitol, xylitol, mannitol, etc.; sugars such as xylose, arabinose, ribose, rhamnose, glucose, fructose, galactose, mannose, sorbose, cellobiose, maltose, etc.; and their partial ethers (e.g. methyl ethers, ethyl esters, etc.), partial acetates, and methylglycosides; poly(vinyl alcohol) (degrees of polymerization=5 to 700), poly(2-hydroxyethyl acrylate) (degrees of polymerization=5 to 700), poly(2-hydroxyethyl methacrylate) (degrees of polymerization=5 to 700), poly(allyl alcohol) (degrees of polymerization=5 to 700). Particularly preferred are glycerin, polyglycerin and trimethylolalkanes and their dimers or trimers.

The polyphenol compound mentioned above includes cresol novolac resin and phenol novolac resin, among others.

The compound (A) having the structure represented by general formula (3) has a polyvinyl backborn chain.

Referring to general formula (3), b represents an integer of 2 to 200. If the value of b is within said range, the viscosity of the compound will be good for efficient dissolution of cationic photopolymerization initiator (B) therein and the fluidity characteristic is suitable for the formation of a film. The range of b is preferably 3 to 100 and, for still better results, 3 to 20. $Q^1$ represents hydrogen, hydroxy, alkyl, aryl, haloalkyl, haloaryl, alkoxycarbonyl, acetoxy, or -X-Z. $Q^1$ may be the same or different over b occurrences in general formula (3). Preferably, in at least five of b occurrences in general formula (3), $Q^1$ is a group substituted by -X-Z.

As examples of $Q^1$ in general formula (3), there can be mentioned hydrogen, hydroxy, alkyl (e.g. methyl, ethyl, etc.), aryl (e.g. phenyl, tolyl, etc.), haloalkyl (e.g. chloromethyl, chloroethyl, etc.), haloaryl (e.g. chloromethylphenyl, chloroethylphenyl, 2,4,6- trichlorophenyl, 2,4,6-tribromophenyl, etc.), alkoxy carbonyl (e.g. methoxycarbonyl, ethoxycarbonyl, butoxy carbonyl, etc.), acetoxy, and -X-Z, among others.

The compound (A) having the structure represented by general formula (4) has a polyester backbone chain.

Referring to general formula (4), c represents an integer of 2 to 200. If the value of c is within said range, the viscosity of the compound will be good for efficient dissolution of cationic photopolymerization initiator (B) therein and the fluidity characteristic is suitable for the formation of a film. The range of c is preferably 2 to 80 and, for still better results, 2 to 20. $A^2$ represents a residue available from an alkylene diol which is substituted by -X-Z or unsubstituted, a residue available from an arylene diol which is substituted by -X-Z or unsubstituted, or a residue available from a polyether diol which is substituted by -X-Z or unsubstituted. $A^3$ represents an alkylene group which is substituted by -X-Z or unsubstituted, an arylene group which is substituted by -X-Z or unsubstituted, an aralkylene group, or a haloalkylene group. In general formula (4), $A^2$ and $A^3$ may each be the same or different over c occurrences. Preferably, each of $A^2$ and $A^3$ represents a group substituted by -X-Z in at least five of c occurrences.

Referring to $A^2$ in general formula (4), the diol giving $A^2$ on elimination of OH groups includes alkylene diols such as ethylene glycol, propylene glycol, 1,3-butanediol, 1,4-butanediol, 1,6-hexanediol, 1,9-nonanediol, neopentyl glycol, 1,4-cyclohexanediol, etc.; arylene diols such as catechol, bis(2-hydroxyphenyl)methane, bis(4-hydroxyphenyl)methane, bisphenol A, etc.; polyether diols such as poly(oxyethylene)diol, poly(oxypropylene)diol, poly(oxytetramethylene)diol, addition product of bisphenol A with ethylene oxide, addition product of bisphenol A with propylene oxide, etc. and the compounds available on substitution of -X-Z for an hydrogen atom other than the OH hydrogen atoms of said diols. Preferred are poly(oxyethylene)diol and poly(oxypropylene)diol.

The degree of polymerization of said polyether diol is generally 2 to 200, preferably 2 to 100, and for still better results, 3 to 20.

As examples of $A^3$ in general formula (4), there can be mentioned an alkylene group such as methylene, ethylene, propylene, pentylene, hexylene, heptylene, octylene, nonylene, decylene, undecylene, etc.; the group available on substitution of -X-Z for one hydrogen atom of an alkylene group such as methylene, ethylene, propylene, butylene, pentylene, hexylene, heptylene, octylene, nonylene, decylene, undecylene, dodecylene, etc.; an arylene group such as phenylene, naphthylene, anthrylene, phenanthrylene, etc.; the group available on substitution of -X-Z for one hydrogen atom of an arylene group such as phenylene, naphthylene, anthrylene, phenanthrylene, etc.; an aralkylene group such as benzylene, 1-phenethylene, 2-phenethylene, 1-phenylpropylene, 2-phenylpropylene, 3-phenylpropylene, etc.; and a haloalkylene group such as chloroethylene, dichloroethylene, bromoethylene, chloromethylethylene, and so on.

As examples of the compound (A) having the structure represented by general formula (4), compounds of the following general formula (13) can be mentioned.

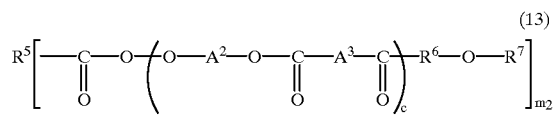
(13)

wherein $R^5$ represents a residue available on elimination of $m_2$ carboxyl groups for a polycarboxylic acid; $R^6$ represents a residue available on elimination of hydroxyl group from any of polyether diols, polyurethane diols and polycarbonate diols. $R^7$ represents propenyl, hydrogen, alkyl, acyl, (meth) acryloyl, or aryl. In at least two of $m_2$ occurrences, $R^7$ represents propenyl. $m_2$ is an integer of 2 to 200.

The polycarboxylic acid mentioned above includes but is not limited to isophthalic acid, terephthalic acid, and adipic acid.

The compound (A) having the structure represented by general formula (5) has a polyester backbone chain.

Referring to general formula (5), d represents an integer of 2 to 200. If the value of d is within said range, the viscosity of the compound will be good for efficient dissolution of cationic photopolymerization initiator (B) therein and the fluidity characteristic is suitable for the formation of a film. The range of d is preferably 2 to 80 and, for still better results, 2 to 20. $A^4$ represents an alkylene group substituted by -X-Z or unsubstituted, an arylene group which is substituted by -X-Z or unsubstituted, an aralkylene group, or a haloalkylene group. In general formula (5), $A^4$ may be the same or different over d occurrences. Preferably, in at least five of d occurrences, $A^4$ represents a group substituted by -X-Z.

As examples of $A^4$ in general formula (5), those mentioned for $A^3$ hereinbefore can be mentioned.

The compound (A) having the structure represented by general formula (6) has a polyurethane backbone chain.

Referring to general formula (6), e represents an integer of 2 to 200. If the value of e is within said range, the viscosity of the compound will be good for efficient dissolution of cationic photopolymerization initiator (B) therein and the fluidity characteristic is suitable for the formation of a film. The range of e is preferably 2 to 50 and, for still better results, 2 to 20. $A^5$ represents a residue available on elimination of isocyanate groups from a diisocyanate. $A^6$ represents a residue available from an alkylene diol which is substituted by -X-Z or unsubstituted, a residue available from an arylene diol which is substituted by -X-Z or unsubstituted, a residue available from a (poly)ether diol which is substituted by -X-Z or unsubstituted, or a residue available from a polyester diol which is substituted by -X-Z or unsubstituted. In d occurrences in general formula (6), $A^5$ and $A^6$ may respectively be the same or different over d occurrences. Preferably, in at least five of d occurrences in general formula (6), each of $A^5$ and $A^6$ represents a group substituted by -X-Z.

As examples of the diisocyanate giving $A^5$ on elimination of isocyanate groups, there can be mentioned tolylene diisocyanate (TDI), p-phenylene diisocyanate, m-phenylene diisocyanate, 1,4-tetramethylene diisocyanate, 1,6-hexamethylene diisocyanate, 2,2,4-trimethylhexamethylene diisocyanate, 1,4-cyclohexane diisocyanate, 4,4'-dicyclohexylmethane diisocyanate (Desmodur W), 4,4'-diphenylmethane diisocyanate (MDI), 1,5-tetrahydronaphthalene diisocyanate, naphthalene-1,5-diisocyanate, bis(2-methyl-3-isocyanatophenyl)methane, 4,4'-diphenylpropane diisocyanate, tetramethylxylylene diisocyanate (TMXDI), isophorone diisocyanate (IPDI), etc. Preferred, among them, are tolylene diisocyanate (TDI), 4,4'-diphenylmethane diisocyanate (MDI), isophorone diisocyanate (IPDI), tetramethylxylylene diisocyanate (TMXDI), 4,4'-dicyclohexylmethane diisocyanate (Desmodur W), and 1,6-hexamethylene diisocyanate.

Referring to $A^6$, the diol giving $A^6$ on elimination of hydroxyl groups includes alkylene diols such as ethylene glycol, propylene glycol, 1,3-butanediol, 1,4-butanediol, 1,6-hexanediol, 1,9-nonanediol, neopentyl glycol, 1,4- cyclohexanediol, etc.; arylene diols such as catechol, bis(2-hydroxyphenyl)methane, bis(4-hydroxyphenyl)methane, bisphenol A, etc.; polyether diols such as poly(oxypropylene)diol, poly(oxytetramethylene)diol, addition product of bisphenol A with ethylene oxide, addition product of bisphenol A with propylene oxide, etc.; polyester diols such as poly(ethylene adipate)diol, poly(butylene isophthalate)diol, polycaprolactonediol, etc.; and the compound available on substitution of -X-Z for one hydrogen atom other than the OH hydrogen atoms of any of such diols. Preferred, among them, are poly(oxyethylene)diol and poly(oxypropylene)diol.

An example of the compound (A) having the structure represented by general formula (6), there can be mentioned compounds of the following general formula (14)

$$R^8[NHCOO-R^9]_{m_3} \qquad (14)$$

wherein $R^8$ represents a residue available on elimination of isocyanate groups from a polyisocyanate; $R^9$ represents $-(Z^1O)n-CH=CH-CH_3$, $-(Z^1O)n-CO-C(R^{10})=CH_2$, $-(Z^1O)nH$, hydrogen, or alkylene; $R^9$ may be $-(Z^1O)n-CH=CH-CH_3$ in at least one of $m_3$ occurences and may be $-(Z^1O)n-CO-C(R^{10})=CH_2$ in at least another one of $m_3$ occurences; $Z^1$ represents an alkylene group of 2 to 12 carbon atoms, an arylene group, an aralkylene group, or a cycloalkylene group; $R^{10}$ represents hydrogen or methyl; n represents an integer of 0 to 200; $m_2$ represents an integer of 2 to 200.

The polyisocyanate mentioned above includes but is not limited to tolylene diisocyanate, 4,4'-diphenylmethane diisocyanate, isophorone diisocyanate, tetramethylxylene diisocyanate, 4,4'-dicyclohexylmethane diisocyanate, 1,6-hexamethylene diisocyanate, triphenylmethane triisocyanate, and tris(isocyanatophenyl)thiophosphate.

The compound (A) having the structure represented by general formula (7) has a polyamide backbone chain.

Referring to general formula (7), f represents an integer of 2 to 200. If the value of f is within said range, the viscosity of the compound will be good for efficient dissolution of cationic photopolymerization initiator (B) therein and the fluidity characteristic is suitable for the formation of a film. The range of f is preferably 2 to 50 and, for still better results, 2 to 20. $A^7$ and $A^8$ may be the same or different and each represents an alkylene group which is substituted by -X-Z or unsubstituted, an arylene group which is substituted by -X-Z or unsubstituted, an aralkylene group, or a haloalkylene groups. $A^7$ and $A^8$ in general formula (7) may be the same or different over f occurrences. Preferably, each of $A^7$ and $A^8$ represents a group substituted by -X-Z in at least five of f occurrences.

As examples of $A^7$ and $A^8$ in general formula (7), those mentioned for $A^3$ hereinbefore can be mentioned.

The compound (A) having the structure represented by general formula (8) has a polyamide backbone chain.

Referring to general formula (8), g represents an integer of 2 to 200. If the value of g is within said range, the viscosity of the compound will be good for efficient dissolution of cationic photopolymerization initiator (B) therein and the fluidity characteristic is suitable for the formation of a film. The range of g is preferably 2 to 50 and, for still better results, 2 to 20. $A^9$ represents an alkylene group substituted by -X-Z or unsubstituted, an arylene group which is substituted by -X-Z or unsubstituted, an aralkylene group, or a haloalkylene group. $A^9$ in general formula (8) may be the same or different over g occurrences. Preferably $A^9$ represents a group substituted by -X-Z in at least five of g occurrences.

As examples of $A^9$ in general formula (8), those mentioned for $A^3$ hereinbefore can be mentioned.

The compound (A) having the structure of general formula (9) has a polycarbonate backbone chain.

Referring to the general formula (9), h represents an integer of 2 to 200. If the value of h is within said range, the viscosity of the compound will be good for efficient dissolution of cationic photopolymerization initiator (B) therein and the fluidity characteristic is suitable for the formation of a film. The range of h is preferably 2 to 50 and, for still better results, 2 to 20. $A^{10}$ represents an alkylene group substituted by -X-Z or unsubstituted, an arylene group which is substituted by -X-Z or unsubstituted, an aralkylene group, or a haloalkylene group. $A^{10}$ in general formula (9) may be the same or different over h occurrences. Preferably $A^{10}$ in general formula (9) represents a group substituted by -X-Z in at least five of h occurrences.

As examples of $A^{10}$ in general formula (9), those mentioned for $A^3$ hereinbefore can be mentioned.

The compound (A) having the structure of general formula (10) has a novolac backbone chain.

Referring to general formula (10), i represents an integer of 2 to 200. If the value of i is within said range, the viscosity of the compound will be good for efficient dissolution of cationic photopolymerization initiator (B) therein and the fluidity characteristic is suitable for the formation of a film. The range of i is preferably 2 to 50 and, for still better results, 2 to 200. Ar represents an aryl group. $Q^2$ represents hydrogen, glycidyl, or -X-Z. In general formula (10), $Q^2$ may be the same or different over i occurrences. Preferably, $Q^2$ in general formula (10) represents -X-Z in at least two of i occurrences.

The compounds (A) represented by general formulas (2) through (10) have propenyl ether groups of formula (1) in the side chains of the backbone and/or at least one of the termini of the backbone chain. Preferred are compounds (A) having said propenyl groups of formula (1) in side chains and both termini of the backbone chain.

The compounds (A) having the structures of general formulas (2) through (10) may have (meth)acryloyl groups in addition to propenyl ether groups.

There is no particular limitation on methods for producing compound (A) for use in the present invention. For example, the compound (A) having the structure of general formula (2) can be obtained by subjecting the corresponding polyfunctional allyl ether group-containing (poly)ether oligomer to reaction with the aid of an alkali catalyst to provide propenyl group-containing ether oligomer. Hereinafter, changing ally ether group to propenyl group with the aid of an alkali catalyst is briefly referred to as propenyl rearrangement reaction.

The alkali catalyst mentioned above includes potassium hydroxide, sodium hydroxide, sodium methoxide, potassium methoxide, sodium ethoxide, potassium ethoxide, potassium t-butoxide, and sodium t-butoxide, among others.

A high reaction rate can be obtained when the alkali catalyst is used in a proportion of 0.01 to 5 molar equivalents, preferably 0.1 to 2 molar equivalents, per 1.0 mol of the polyfunctional allyl ether group-containing (poly) ether oligomer.

The reaction solvent that can be used includes but is not limited to dimethyl sulfoxide, dimethylformamide, tetrahydrofuran, dioxane, acetonitrile, butanol, ethylene glycol dimethyl ether, methanol, ethanol, propanol, toluene, and polyethylene glycol (molecular weight=100 to 20000).

The reaction temperature is 30 to 170° C. and preferably 60 to 120° C.

The isolation and purification of the compound after completion of the reaction can be carried out by known procedures. For example, after cooling to room temperature, the reaction mixture is extracted with toluene or ether and the organic extract is washed with water a few times to remove the inorganic salt. The organic phase is taken and concentrated under reduced pressure to obtain the compound. Of course, this is not an exclusive choice. It is preferable practice to neutralize the excess alkali with an acid after cooling the reaction mixture to room temperature.

The above polyfunctional allyl ether group-containing (poly)ether oligomer can be synthesized typically by subjecting allyl chloride and a polyol to etherification reaction in the presence of an alkali catalyst. The alkali catalyst that can be used includes potassium hydroxides sodium hydroxide, sodium methoxide, potassium methoxide, sodium ethoxide, potassium ethoxide, potassium t-butoxide, and sodium t-butoxide, among others. The allyl etherification need not be complete and thorough but 20 mol % of hydroxyl groups may remain free.

A high reaction rate can be achieved when the alkali catalyst is used in a proportion of 0.8 to 10 molar equivalents, preferably 1 to 2 molar equivalents, per 1.0 mol of the polyol.

The equivalent ratio of polyol to allyl chloride is generally 1:1.0 to 10.0 and preferably 1:1.0 to 2.0.

The cationic photopolymerization initiator (B) that can be used in the present invention includes a variety of known initiators such as triphenylsulfonium hexafluoroantimonate, triphenylsulfonium phosphate, p-(phenylthio) phenyldiphenylsulfonium hexafluoro antimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-(diphenylsulfonio)phenyl] sulfide-bis-hexafluorophosphate, bis[4-(diphenylsulfonio) phenyl]sulfide-bis-hexafluoroantimonate, (2,4-cyclopentadien-1-yl)-[(1-methylethyl)benzene]-Fe-hexafluorophosphate, diallyliodonium hexafluoroantimonate, and so on. These compounds are readily available from commercial sources. For example, SP-150 and SP-170 can be purchased from Asahi Denka Kogyo K.K., Irgacure 261 from Ciba-Geigy, UVR-6974 and UVR-6990 from Union Carbide, and CD-1012 from Sartomer Co.

In the practice of the present invention, the cationic photopolymerization initiator (B) is preferably an onium salt.

As said onium salt, it is preferable to use at least one species selected from the group consisting of triarylsulfonium salts and diaryliodonium salts.

In the practice of the present invention, the weight ratio of compound (A) to cationic photopolymerization initiator (B) is generally 95:5 through 99.9:0.01. If the proportion of cationic photopolymerization initiator (B) is less than 0.01, no adequate polymerization initiation effect will be obtained. Conversely the use of the initiator (B) in excess of 5 parts results in no further increase in the effect and is uneconomical. The preferred ratio is 96:4 through 98:2.

The photocurable resin composition of the present invention may further contain a reactive diluent (C) of the following general formula (11), the molecular weight of which is less than 500, for the purpose of viscosity adjustments.

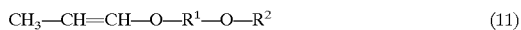

$$CH_3—CH=CH—O—R^1—O—R^2 \quad (11)$$

In the above general formula (11), $R^1$ represents a residue available on elimination of OH groups from an alkylene diol, arylene diol, polyether diol or polyester diol of the formula $HO—R^1—OH$. $R^2$ represents alkyl, aryl, aralkyl, cycloalkyl, or hydrogen atom.

As represented by $HO—R^1—OH$, the alkylene diol includes but is not limited to ethylene glycol, propylene glycol, 1,3-butanediol, 1,4-butanediol, 1,6-hexanediol, 1,9-nonanediol, neopentyl glycol, and 1,4-cyclohexanediol; the arylene diol includes but is not limited to catechol, bis(2-hydroxyphenyl)methane, bis(4-hydroxyphenyl)methane, and bisphenol A; the polyether diol includes but is not limited to poly(oxyethylene)diol, poly(oxypropylene)diol, poly(oxytetramethylene)diol, an addition product of bisphenol A with ethylene oxide, and an addition product of bisphenol A with propylene oxide; the polyester diol includes but is not limited to poly(ethylene adipate)diol, poly(butylene isophthalate) diol, and polycaprolactonediol. Preferred, among them, are poly(oxyethylene)diol and poly(oxypropylene)diol.

As examples of $R^2$ in general formula (11), there can be mentioned hydrogen atom; alkyl such as methyl, ethyl, propyl, butyl, pentyl, hexyl, heptyl, octyl, nonyl, decyl, undecyl, dodecyl, etc.; aryl such as phenyl, naphthyl, anthryl, phenanthryl, etc.; aralkyl such as benzyl, 1-phenethyl, 2-phenethyl, 3-phenylpropyl, 2-phenylpropyl, 1-phenylpropyl, etc.; and cycloalkyl such as cyclopentyl, cyclohexyl, cycloheptyl, cyclooctyl, etc.

The above-mentioned reactive diluent (C) has a molecular weight of less than 500. If the molecular weight is within said range, the solubility of the cationic photopolymerization initiator (B) will be sufficient.

The proportion of said reactive diluent (C) relative to the combined weight of said compound (A) and cationic photopolymerization initiator (B) is generally 5 to 60 weight % and preferably 10 to 30 weight %. If the limit of 60 weight % is exceeded, the curing speed will be drastically decreased.

Where necessary, the photocurable resin composition of the present invention may further contain a radical polymerizable vinyl compound (D) and a photoradical polymerization initiator (E).

The radical polymerizable vinyl compound (D) that can be used includes a variety of known radical polymerizable vinyl compounds. Thus, (meth)acrylate monomers such as triethylene glycol di(meth)acrylate, tetraethylene glycol di(meth)acrylate, polyethyleneglycol di(meth)acrylate, 1,4-butanediol di(meth)acrylate, tripropylene glycol di(meth) acrylate, etc.; styrene, vinyl chloride, vinyl acetate, vinyl ether, acrylic acid, methacrylic acid; and (meth)acrylate oligomers such as epoxy (meth)acrylate, urethane (meth) acrylate, etc. can be mentioned by way of example.

The proportion of said radical polymerizable vinyl compound (D) is preferably 0 to 100 parts by weight and, for still better results, 0 to 50 parts by weight based on 100 parts by weight of said compound (A).

As said photoradical polymerization initiator (E), a variety of known ones can be employed. For example, benzoin alkyl ethers such as benzoin ethyl ether, benzoin isobutyl ether, etc., acetophenones such as 2,2-diethoxyacetophenone etc., and anthroquinone initiators such as benzyl dimethyl ketal etc. can be mentioned by way of example.

The proportion of said photoradical polymerization initiator (E) is generally 1 to 5 weight % and preferably 2 to 5 weight % based on the combined weight of said compound (A) and said cationic photopolymerization initiator (B).

Where necessary, the photocurable resin composition of the present invention may be supplemented with various additives such as organic solvents, epoxy resin (e.g. bisphenol A epoxy resin, bisphenol F epoxy resin, tetrabromobisphenol A epoxy resin, novolac epoxy resin, etc.), pigments, coloring agents, inorganic fillers, non-reactive resin, and so on.

The photocurable resin composition of the present invention can be manufactured typically by mixing and dissolving the above-mentioned components and others.

The photocurable resin composition of the present invention can be easily cured by irradiation with UV light or an electron beam in the per se known manner to provide a cured artefact. There is no limitation on the ultraviolet-irradiating equipment that can be used. Thus, for example, a high-pressure mercury-vapor lamp, a low-pressure mercury-vapor lamp, and a metal halide lamp can be mentioned. As examples of the electron beam-irradiating equipment, a scanning irradiator manufactured by Nisshin Electric Co., Ltd. and a curtain system irradiator manufactured by Iwasaki Electric Co., Ltd. can be mentioned.

The structure of the backbone between propenyl ether groups, or the structure of the backbone between these functional groups where the compound (A) of the invention has (meth)acryloyl groups in addition to propenyl ether groups, can be varied to control the flow characteristic and cured resin properties over a broad range. Moreover, by optimizing the balance between the number of propenyl ether groups and the backbone structure of the polymer, the flow characteristics and physical properties of cured resin can be improved. Where the backbone chain is a polyester chain, an improved adhesion to metal can be expected.

The photocurable resin composition of the present invention exhibits proper viscosity having superior flow characteristics and fast-curing properties as compared with the conventional photosensitive resin composition using an acrylate resin, epoxy resin, or vinyl ether resin. Moreover, because of the absence of polymerization inhibition due to oxygen, a satisfactory surface hardness can be insured.

The photocurable resin composition of the present invention cures at a remarkable high speed in the air and insures very satisfactory physical properties of cured resin. Therefore, it can be put to use in a diversity of applications such as coating agents for metal, plastic, paper, glass, rubber, wood, and other substrates; paints, printing inks, molding materials, photo-resist materials, and so on. Particularly, the composition is suitable for use in printed circuit board (PCB) resists, printing inks, paints, paper coatings, metal coatings, optical fiber coatings, hard coatings, and adhesives.

When used as a photosensitive resin composition, the photocurable resin composition of the present invention described above is faster-curing than any of the conventional acrylate, epoxy, and vinyl ether type photosensitive resin compositions and, in addition, because of the optimized balance between the number of propenyl ether groups and the polymer backbone structure, is capable of expressing excellent fluidity and cured physical characteristics.

EXAMPLES

The following examples are merely intended to describe the present invention in further detail and should by no means be construed as defining the scope of the invention.

Synthesis of compound (A)

Example of Synthesis-1

A 500 ml-SUS autoclave was charged with 46.0 g (0.5 mol) of glycerol and 0.5 g of potassium hydroxide (KOH), and 264.3 g (6.0 mol) of ethylene oxide was added thereto dropwise via a pressure-resistant tap funnel, and the reaction was conducted at 110° C. for 5 hours. After the internal temperature was decreased to 80° C., 84.2 g of KOH, 9.67 g of n-tetrabutylammonium bromide, and 40 g of toluene were added. Then, 114.8 g (1.5 mol) of allyl chloride was further added gradually dropwise for 1 hour at 80° C. and the mixture was reacted for 5 hours. Thereafter, 200 g of water was added and the excess alkali and byproduct salt were removed by phase separation. From the organic phase, the unreacted allyl chloride and toluene were distilled off under 100 mmHg at 50° C. The residue was put in an eggplant type glass flask and 32.4 g of potassium t-butoxide, as catalyst, and 50 g of dimethyl sulfoxide, as reaction solvent, were added and the mixture was reacted at 90° C. for 15 minutes (rearrangement reaction). Then, 200 g of water was added and the excess alkali was removed by phase separation. From the organic phase, dimethyl sulfoxide was removed under 10 mmHg at 80° C., whereby 333.4 g of a terminal propenyl ether group-containing ether oligomer [hereinafter referred to as compound (1)] was obtained as Compound (A). This compound was identified by $^1$H-NMR and $^{13}$C-NMR spectrometric analyses.

Example of Synthesis-2

A 500 ml-SUS autoclave was charged with 67.1 g (0.5 mol) of trimethylolpropane and 0.5 g of KOH, and 264.3 g (6.0 mol) of ethylene oxide was added thereto dropwise via a pressure-resistant tap funnel, and the reaction was conducted at 110° C. for 5 hours. After the internal temperature was decreased to 80° C., 84.2 g of KOH, 9.67 g of n-tetrabutylammonium bromide, and 40 g of toluene were added. Then, 114.8 g (1.5 mol) of allyl chloride was gradually added dropwise for 1 hour at 80° C. and the mixture was allowed to react for 5 hours. Thereafter, 200 g of water was added and the excess alkali and byproduct salt were removed by phase separation. The organic solution was distilled under 100 mmHg at 50° C. to remove the unreacted allyl chloride and toluene and the residue was put in an eggplant type glass flask. Then, 32.4 g of potassium t-butoxide as catalyst and 50 g of dimethyl sulfoxide as reaction solvent were added and the reaction was carried out at 90° C. for 15 minutes (rearrangement reaction). Thereafter, 200 g of water was added and the excess alkali was removed by phase separation. From the organic phase, dimethyl sulfoxide was removed under 10 mmHg at 80° C., whereby 343.5 g of a terminal propenyl ether group-containing ether oligomer [hereinafter referred to as compound (2)] was obtained as compound (A). This compound was identified by $^1$H-NMR and $^{13}$C-NMR spectrometric analyses.

Example of Synthesis-3

A 500 ml-SUS autoclave was charged with 46.0 g (0.5 mol) of glycerol and 0.5 g of KOH, and 528.6 g (12.0 mol) of ethylene oxide was added thereto dropwise via a pressure-resistant tap funnel, and the reaction was conducted at 110° C. for 5 hours. After the internal temperature was decreased to 80° C., 84.2 g of KOH, 9.67 g of n-tetrabutylammonium bromide, and 40 g of toluene were added. Then, 114.8 g (1.5 mol) of allyl chloride was further added gradually dropwise for 1 hour at 80° C. and the reaction was conducted for 5 hours. Thereafter, 200 g of water was added and the excess alkali and byproduct salt were removed by phase separation. From the organic phase, the unreacted allyl chloride and toluene were distilled off under 100 mmHg at 50° C. The residue was put in an eggplant type glass flask and 32.4 g of potassium t-butoxide, as catalyst, and 50 g of dimethyl sulfoxide, as reaction solvent, were added and the mixture was reacted at 90° C. for 15 minutes (rearrangement reaction). Then, 200 g of water was added and the excess alkali was removed by phase separation. From the organic phase, dimethyl sulfoxide was removed under 10 mmHg at 80° C., whereby 338.4 g of a terminal propenyl ether group-containing ether oligomer [hereinafter referred to as compound (3)] was obtained as Compound (A). This compound was indentified by $^1$H-NMR and $^{13}$C-NMR spectrometric analyses.

Example of Synthesis-4

A 500 ml-SUS autoclave was charged with 46.0 g (0.5 mol) of glycerol and 0.5 g of KOH, and 696.0 g (12.0 mol) of propylene oxide was added thereto dropwise via a pressure-resistant tap funnel, and the reaction was conducted at 110° C. for 5 hours. After the internal temperature was decreased to 80° C., 84.2 g of KOH, 9.67 g of n-tetrabutylammonium bromide, and 40 g of toluene were added. Then, 114.8 g (1.5 mol) of allyl chloride was further added gradually dropwise for 1 hour at 80° C. and the mixture was reacted for 5 hours. Thereafter, 200 g of water was added and the excess alkali and byproduct salt were removed by phase separation. From the organic phase, the unreacted allyl chloride and toluene were distilled off under 100 mmHg at 50° C. The residue was put in an eggplant type glass flask and 32.4 g of potassium t-butoxide, as catalyst, and 50 g of dimethyl sulfoxide, as reaction solvent, were added and the mixture was reacted at 90° C. for 15 minutes (rearrangement reaction). Then, 200 g of water was added and the excess alkali was removed by phase separation. From the organic phase, dimethyl sulfoxide was removed under 10 mmHg at 80° C., whereby 419.4 g of a terminal propenyl ether group-containing ether oligomer [hereinafter referred to as compound (4)] was obtained as Compound (A). This compound was identified by $^1$H-NMR and $^{13}$C-NMR spectrometric analyses.

Example of Synthesis-5

A 500 ml-SUS autoclave was charged with 67.1 g (0.5 mol) of trimethylolpropane and 0.5 g of KOH, and 348.5 g (6.0 mol) of propylene oxide was added thereto dropwise via a pressure-resistant tap funnel, and the reaction was conducted at 110° C. for 5 hours. After the internal temperature was decreased to 80° C., 84.2 g of KOH, 9.67 g of n-tetrabutylammonium bromide, and 40 g of toluene were added. Then, 114.8 g (1.5 mol) of allyl chloride was gradually added dropwise for 1 hour at 80° C. and the mixture was allowed to react for 5 hours. Thereafter, 200 g of water was added and the excess alkali and byproduct salt were removed by phase separation. The organic phase was distilled under 100 mmHg at 50° C. to remove the unreacted allyl chloride and toluene and the residue was put in an eggplant type glass flask. Then, 32.4 g of potassium t-butoxide as catalyst and 50 g of dimethyl sulfoxide as reaction solvent were added and the reaction was carried out at 90° C. for 15 minutes (rearrangement reaction). Thereafter, 200 g of water was added and the excess alkali was removed by phase separation. From the organic phase, dimethyl sulfoxide was removed under 10 mmHg at 80° C., whereby 349.5 g of a propenyl ether-terminated ether oligomer [hereinafter referred to as compound (5)] was obtained as compound (A). This compound was identified by $^1$H-NMR and $^{13}$C-NMR spectrometric analyses.

Examples 1 to 5 and Comparative Examples 1 to 3

Photocurable resin compositions of the present invention were prepared by mixing and dissolving components according to the recipes (parts by weight) shown in Table 1. Using a bar coater, each composition was coated in a thickness of 20 μm on a glass plate and irradiated with an ultraviolet irradiator (one 80 W/cm high-pressure mercury-vapor lamp) at a distance of 10 cm and an irradiation intensity of 160 mW/cm$^2$ to determine the tack-free minimum energy. The gloss, adhesion, and hardness were evaluated by the following methods. The results are shown in Table 2.

[Evaluation methods]

Tack-free minimum energy: The irradiation dose (UV mJ/cm$^2$) required till the cured surface became free from tack was determined.

Gloss: The cured surface gloss was visually evaluated.

| | |
|---|---|
| ○ | High gloss |
| Δ | Low gloss |
| X | No gloss |

Adhesion: A cellophane adhesive tape (Cello Tape; tradename) was applied to the cured resin surface and, then, peeled off.

Criteria:

| | |
|---|---|
| ○ | No change at all |
| X | The resin coat only was peeled off |
| Δ | Intermediate between ○ and X |

Hardness: The cured resin surface was scratched with a fingernail.

Criteria:

| | |
|---|---|
| ○ | Not injured |
| X | Easily injured |
| Δ | Intermediate between ○ and X |

TABLE 1

| | | Example | | | | | Comparative Example | | |
|---|---|---|---|---|---|---|---|---|---|
| | | 1 | 2 | 3 | 4 | 5 | 1 | 2 | 3 |
| parts by weight | Coumpound (1) | 100 | — | — | — | — | — | — | — |
| | Coumpound (2) | — | 100 | — | — | — | — | — | — |
| | Coumpound (3) | — | — | 100 | — | — | — | — | — |
| | Coumpound (4) | — | — | — | 100 | — | — | — | — |

TABLE 1-continued

|  | Example | | | | | Comparative Example | | |
| --- | --- | --- | --- | --- | --- | --- | --- | --- |
|  | 1 | 2 | 3 | 4 | 5 | 1 | 2 | 3 |
| Coumpound (5) | — | — | — | — | 100 | — | — | — |
| SP-170 (*1) | 2 | — | — | — | — | — | — | — |
| UVR-6974 (*2) | — | 2 | 2 | 2 | 2 | — | — | — |
| Triethylene glycol divinyl ether | — | — | — | — | — | 100 | — | — |
| Epoxy-containing ether oligomer (i) | — | — | — | — | — | — | 100 | — |
| Acryloyl-containing ether oligomer (ii) | — | — | — | — | — | — | — | 100 |
| UVR-6990 (*3) | — | — | — | — | — | 2 | 2 | — |
| Irgacure 184 (*4) | — | — | — | — | — | — | — | 2 |

The particulars of the components shown are as follows.

Epoxy-containing ether oligomer (i): a terminal epoxy group-containing ether oligomer synthesized by the same procedure as Example of Synthesis-1 except that epichlorohydrin was used in lieu of allyl chloride.

Acryloyl-containing ether oligomer (ii): a terminal acryloyl group-containing ether oligomer synthesized by the same procedure as Example of Synthesis-1 except that methyl acrylate was used in lieu of allyl chloride.

SP-170 (*1): a cationic photo polymerization initiator manufactured by Asahi Denka Kogyo K.K., a 50% dilution of polyphenylsulfonium hexafluoroantimonate.

UVR-6974 (*2): a cationic photo polymerization initiator manufactured by Union Carbide Co., a 50% dilution of a mixture of p-(phenylthio)phenyldiphenylsulfonium hexafluoroantimonate and bis[4-(diphenyl sulfonio)phenyl]-sulfide-bis-hexafluoroantimonate.

UVR-6990 (*3): a cationic photo polymerization initiator manufactured by Union Carbide Co.

Irgacure 184 (*4): a cationic photo polymerization initiator manufactured by Ciba-Geigy.

TABLE 2

|  | Example | | | | | Comparative Example | | |
| --- | --- | --- | --- | --- | --- | --- | --- | --- |
|  | 1 | 2 | 3 | 4 | 5 | 1 | 2 | 3 |
| Tack-free minimum energy (mJ/cm$^2$) | 20 | 35 | 20 | 31 | 24 | 50 | 900 | 800 |
| Gloss | ◯ | ◯ | ◯ | ◯ | ◯ | Δ | Δ | ◯ |
| Adhesion | ◯ | ◯ | ◯ | ◯ | ◯ | Δ | ◯ | Δ |
| Hardness | ◯ | ◯ | ◯ | ◯ | ◯ | Δ | ◯ | Δ |

Synthesis of Compound (A)

Example of Synthesis-6

To 46.3 g (0.5 mol) of epichlorohydrin was added 0.093 g of boron trifluoride etherate as catalyst and the reaction was conducted at 40° C. for 2 hours. This reaction mixture was neutralized with sodium hydroxide and washed with water to provide 46.0 g of a yellow clear polyepichlorohydrin. This polyepichlorohydrin had a number-average molecular weight of 1330 determined by gel permeation chromatography (GPC) and a viscosity of 5.9 poises (25° C.). While 46.0 g of this polyepichlorohydrin was heated to 80° C. with stirring, 33.6 g (0.6 mol) of KOH, 9.67 g of n-tetrabutylammonium bromide, and 40 g of toluene were added. Then, 34.8 g (0.6 mol) of allyl alcohol was gradually added dropwise for 1 hour at 80° C. and the mixture was allowed to react for 5 hours. Thereafter, 200 g of water was added and the excess alkali, by product salt, and excess allyl alcohol were removed by phase separation. From the organic phase, the toluene was distilled off under 100 mmHg at 50° C. to obtain 53.0 g of a poly(allyl ether) compound. This product had a GPC number-average molecular weight of 1500, a viscosity of 10.2 poises (25° C.), an allyl ether/hydroxy/chlorine molar ratio of 62/8/30 as determined by $^1$H-NMR spectrometry, and an allyl etherification rate of 85%. An eggplant type glass flask was charged with 50.0 g of this poly(allyl ether), and after addition of 32.4 g of potassium t-butoxide as catalyst and 50 g of dimethyl sulfoxide as reaction solvent, the reaction was conducted at 90° C. for 15 minutes (rearrangement reaction). Then, 200 g of water was added and the excess alkali was removed by phase separation. The organic phase was distilled under 10 mmHg at 80° C. to remove dimethyl sulfoxide, whereby 48.4 g of a terminal propenyl ether group-containing compound [hereinafter referred to as compound (6)] was obtained as Compound (A). As determined by $^1$H-NMR and $^{13}$C-NMR spectrometry, the rate of conversion of allyl to propenyl was 98%.

Example of Synthesis-7

To 37.0 g (0.5 mol) of glycidol was added 0.093 g of boron trifluoride etherate as catalyst and the reaction was conducted at 40° C. for 3 hours. This reaction mixture was neutralized with sodium hydroxide and washed with water to provide 36.5 g of a yellow clear polyglycidol. This polyglycidol had a GPC number-average molecular weight of 1480 and a viscosity of 10.9 poises (25 ° C.). While 36.8 g of this polyglycidol was heated to 80° C. with stirring, 33.6 g (0.6 mol) of KOH, 9.67 g of n-tetrabutylammonium bromide, and 40 g of toluene were added. Then, 46.0 g (0.6 mol) of allyl chloride was gradually added dropwise for 1 hour at 80° C. and the mixture was allowed to react for 5 hours. Thereafter, 200 g of water was added and the excess alkali and byproduct salt were removed by phase separation. From the organic phase, the unreacted allyl chloride and toluene were distilled off under 100 mmHg at 50° C. to obtain 50.2 g of a poly(allyl ether) compound. This product had a GPC number-average molecular weight of 1400, a viscosity of 30.2 poises (25° C.), and an allyl etherification rate of 90% as estimated by $^1$H-NMR analysis. An eggplant type glass flask was charged with 50.0 g of this poly(allyl ether), and after addition of 32.4 g of potassium t-butoxide as catalyst and 50 g of dimethyl sulfoxide as reaction solvent, the reaction was conducted at 90° C. for 15 minutes (rearrangement reaction). Then, 200 g of water was added and the excess alkali was removed by phase separation. The organic phase was distilled under 10 mmHg at 80° C. to remove water, whereby 48.5 g of a terminal propenyl ether group-containing compound [hereinafter referred to as compound (7)] was obtained as Compound (A). As determined by $^1$H-NMR and $^{13}$C-NMR spectrometry, the rate of conversion of allyl to propenyl was 98%.

Example of Synthesis-8

To 29.0 g of methyl ethyl ketone heated to 80° C. was added a solution of 58.1 g (0.5 mol) 2-hydroxyethylacrylate and 0.58 g azobisisobutyronitrile in 29.0 g methyl ethyl ketone dropwise for 2 hours at 80° C. and the reaction was carried out for 3 hours. The resulting poly(2-hydroxyethyl acrylate) had a GPC number-average molecular weight of 2000. To 60 g of methyl ethyl ketone was added 28.0 g of the above poly(2-hydroxyethyl acrylate) and the mixture was heated to 80° C. with stirring. Then, 33.6 g (0.6 mol) of KOH and 9.67 g of n-tetrabutylammonium bromide were added, and 46.0 g (0.6 mol) of allyl chloride was further added gradually dropwise for 1 hour at 80° C. The reaction mixture was then conducted for 5 hours. Thereafter, 200 g of water was added and the excess alkali and byproduct salt were removed by phase separation. From the organic phase, the unreacted allyl chloride and methyl ethyl ketone were distilled off under 100 mmHg at 50° C. to obtain 58.2 g of a poly(allyl ether) compound. The allyl etherification rate of this product was 79% as determined by $^1$H-NMR spectrometry. An eggplant type glass flask was charged with 80.0 g of the above poly(allyl ether), and 32.4 g of potassium t-butoxide as catalyst and 50 g of dimethyl sulfoxide as reaction solvent were added. The reaction was then conducted at 90° C. for 15 minutes (rearrangement reaction). Therefore, 200 g of water was added and the excess alkali was removed by phase separations Then, water was removed from the product under 10 mmHg at 80° C. to provide 62.4 g of a terminal propenyl ether group-containing compound [hereinafter referred to as compound (8)] as Compound (A). As determined by $^1$H-NMR and $^{13}$C-NMR spectrometry, the rate of conversion from allyl to propenyl was 99%.

Example of Synthesis-9

To 32.0 g of methyl ethyl ketone heated to 80° C. was added a dilution of 64.1 g (0.5 mol) 2-hydroxyethyl methacrylate and 0.64 g azobisisobutyro nitrile in 32.0 g methyl ethyl ketone dropwise for 2 hours at 80° C. and the mixture was allowed to react for 3 hours. The number-average molecular weight of the resulting poly(2-hydroxyethyl methacrylate) was 3500. To 50 g of methyl ethyl ketone was added 63.5 g of the above poly(2-hydroxyethyl methacrylate), and with the mixture being heated at 80° C. with stirring, 33.6 g (0.6 mol) of KOH and 9.67 g of n-tetrabutylammonium bromide were added. Then, 46.0 g (0.6 mol) of allyl chloride was added gradually dropwise for 1 hour at 80° C. and the reaction was conducted for 5 hours. Thereafter, 200 g of water was added and the excess alkali and byproduct salt were removed by phase separation. From the organic phase, the unreacted allyl chloride and methyl ethyl ketone were distilled off under 100 mmHg at 50° C. to obtain 95.2 g of a poly(allyl ether) compound. The allyl etherification rate of this compound as determined by $^1$H-NMR analysis was 75%. An eggplant type glass flask was charged with 90.0 g of the poly(allyl ether) compound, followed by addition of 32.4 g of potassium t-butoxide as catalyst and 50 g of dimethyl sulfoxide as reaction solvent. The mixture was allowed to react at 90° C. for 15 minutes (rearrangement reaction). Thereafter, 200 g of water was added and the excess alkali was removed by phase separation. From the organic phase, water was further removed at 80° C. and 100 mmHg to provide 80.1 g of a terminal propenyl ether group-containing compound [hereinafter referred to as compound (9)] as Compound (A). As determined by $^1$H-NMR and $^{13}$C-NMR spectrometric analyses, the rate of conversion from allyl to propenyl was 97%.

Example of Synthesis-10

In an autoclave, 22.5 g of polyvinyl alcohol (degree of polymerization=200, degree of saponification=89 mol %) was heated to 80° C. with stirring and 33.6 g of KOH, 9.67 g of n-tetrabutylammonium bromide, and 40 g of toluene were added. Then, 46.0 g (0.6 mol) of allyl chloride was added gradually dropwise for 1 hour at 80° C. and the reaction was conducted for 5 hours. Thereafter, the reaction mixture was diluted with 200 g of water and the excess alkali and by-product salt were removed by phase separation. From the organic phase, the unreacted allyl chloride and toluene were distilled off under 100 mmHg at 50° C. to obtain 52.5 g of a poly(allyl ether) compound. The allyl etherification rate of this compound as determined by $^1$H-NMR spectrometry was 78%. An eggplant type glass flask was charged with 50.0 g of the poly(allyl ether) followed by addition of 32.4 g of potassium t-butoxide as catalyst and 50 g of dimethyl sulfoxide as reaction solvent. The mixture was allowed to react at 90° C. for 15 minutes (rearrangement reaction). Then, 200 g of water was added and the excess alkali was removed by phase separation. From the organic phase, water was further removed under 100 mmHg at 80° C. to provide 33.6 g of a terminal propenyl ether group-containing compound [hereinafter referred to as compound (10)] as Compound (A). As determined by $^1$H-NMR and $^{13}$C-NMR spectrometry, the rate of conversion from allyl to propenyl was 97%.

Examples 6 to 10 and Comparative Examples 4 to 6

According to the recipes (parts by weight) shown in Table 3, the respective components were mixed and dissolved to provide photocurable resin compositions of the present invention. Using a bar coater, each composition was coated in a thickness of 20 μm on a copper plate and a PMMA plate and irradiated using an ultraviolet irradiator (one 80 W/cm high-pressure mercury-vapor lamp) at a distance of 10 cm and an irradiation intensity of 160 mW/cm$^2$ to determine the tack-free minimum energy. The adhesion (to copper and PMMA) and surface hardness were evaluated after curing with an irradiation energy of 500 mJ/cm$^2$ (other conditions were as described above). The results are set forth in Table 4.

Evaluation methods

Tack-free minimum energy: the irradiation dose (UV mJ/cm$^2$) required till the cured surface became free from tack.

Adhesion: according to JIS D 0202, the test piece after curing was made grid and spread a cellophane adhesive tape (Cello Tape: trade name) to subject to peeling test and the result was visually evaluated.

| Criteria: |
|---|
| ☉ No change at all for 100/100 |
| ○ Slight peeling along cuts for 100/100 |
| Δ 50/100 to 90/100 |
| x 0/100 to 50/100 |

Surface hardness: the surface hardness of each test piece after curing was evaluated in terms of pencil hardness.

TABLE 3

| | | Example | | | | | Comparative Example | | |
|---|---|---|---|---|---|---|---|---|---|
| | | 6 | 7 | 8 | 9 | 10 | 4 | 5 | 6 |
| parts by weight | Coumpound (6) | 80 | — | — | — | — | — | — | — |
| | Coumpound (7) | — | 80 | — | — | — | — | — | — |
| | Coumpound (8) | — | — | 80 | — | — | — | — | — |
| | Coumpound (9) | — | — | — | 80 | — | — | — | — |
| | Coumpound (10) | — | — | — | — | 80 | — | — | — |
| | Propenyl ether-containing compound (iii) | 20 | 20 | 20 | 20 | 20 | — | — | — |
| | Acrylate-containing compound (iv) | — | — | — | — | — | 100 | — | — |
| | Epoxy-terminated compound (v) | — | — | — | — | — | — | 100 | — |
| | Alicyclic epoxy-containing compound (vi) | — | — | — | — | — | — | — | 100 |
| | UVR-6974 (*2) | 5 | 5 | 5 | 5 | 5 | — | 5 | 5 |
| | Irgacure 184 (*4) | — | — | — | — | — | 5 | — | — |

The particulars of the compounds shown are as follows.

Propenyl ether-containing compound (iii): $CH_3$—$CH$=$CH$—$O$—$(CH_2CH_2O)_6$—$H$ Acrylate-containing compound (iv): $CH_2$=$CH$—$C$(=$O$)$O$—$(CH_2CH_2O)_{12}$—$C$(=$O$)—$CH$=$CH_2$ Epoxy-containing compound (v): EP-828 (manufactured by Yuka Shell, a bisphenol-type epoxy resin)

Alicyclic epoxy-terminated compound (vi): ERL-4221 (manufactured by UCC, an alicyclic epoxy resin)

TABLE 4

| | Example | | | | | Comparative Example | | |
|---|---|---|---|---|---|---|---|---|
| | 6 | 7 | 8 | 9 | 10 | 4 | 5 | 6 |
| Tack-free minimum energy (mJ/cm²) | 30 | 35 | 20 | 45 | 34 | 800 | 850 | 900 |
| Adhesion to copper | ◉ | ◉ | ◉ | ◉ | ◉ | x | x | ◉ |
| Adhesion to PMMA | ◉ | ◉ | ◉ | ◉ | ◉ | o | o | x |
| Pensil hardness | H | 2H | H | 2H | H | B | B | H |

Synthesis of Compound A

Example of Synthesis-11

An SUS autoclave was charged with 246.2 g (1.0 mol) of dipentaerythritol and 20.0 g of KOH and with 660.1 g (15.0 mol) of ethylene oxide being dripped from a tap funnel, the reaction was conducted at 170° C. for 5 hours. This reaction mixture was diluted with 500 g of aqueous NaCl solution and the excess potassium hydroxide and by-product salt were removed by phase separation to provide 788.6 g of an addition product of dipentaerythritol with ethylene oxide. In an autoclave, 500 g of this addition product of dipentaerythritol with ethylene oxide was heated at 80° C. with stirring and 33.6 g of KOH, 9.67 g of n-tetrabutylammonium bromide, and 200 g of toluene were added. Then, 397.8 g (5.2 mol) of allyl chloride was added gradually dropwise for 1 hour at 80° C. and the mixture was further allowed to stand for 2 hours, then heated at 170° C. for 3 hours to rearrangement reaction. This reaction mixture was diluted with 300 g of water and the excess alkali and by-product salt were removed by phase separation. From the organic phase, the unreacted allyl chloride and toluene were removed under 100 mmHg at 50° C. to provide 710.3 g of a terminal propenyl ether group-containing compound [hereinafter referred to as compound (11)] as Compound (A). This product was identified by $^1$H-NMR and $^{13}$C-NMR spectrometric analyses.

Example of Synthesis-12

An SUS autoclave was charged with 246.2 g (1.0 mol) of dipentaerythritol and 20.0 g of KOH and with 793.0 g (18.0 mol) of ethylene oxide being dripped from a tap funnel, the reaction was conducted at 170° C. for 5 hours. This reaction mixture was diluted with 500 g of aqueous NaCl solution and the excess potassium hydroxide and by-product salt were removed by phase separation to provide 798.6 g of an addition product of dipentaerythritol with ethylene oxide. In an autoclave, 500 g of this addition product of dipentaerythritol with ethylene oxide was heated at 80° C. with stirring and 33.6 g of KOH, 9.67 g of n-tetrabutylammonium bromide, and 200 g of toluene were added. Then, 535.5 g (700 mol) of allyl chloride was added gradually dropwise for 1 hour at 80° C. and the mixture was further allowed to stand for 2 hours, then heated at 170° C. for 3 hours to conduct rearrangement reaction. This reaction mixture was diluted with 300 g of water and the excess alkali and by-product salt were removed by phase separation. From the organic phase, the unreacted allyl chloride and toluene were removed under 100 mmHg at 50° C. to provide 720.3 g of a terminal propenyl ether group-containing compound [hereinafter referred to as compound (12)] as Compound (A). This product was identified by $^1$H-NMR and $^{13}$C-NMR spectrometric analyses.

Example of Synthesis-13

1. Synthesis of an addition product of allyl alcohol with ethylene oxide

An SUS autoclave was charged with 58.1 g (1.0 mol) of allyl alcohol and 5.8 g of KOH, and with 132.2 g (3.0 mol) of ethylene oxide being dripped from a tap funnel, the reaction was conducted at 170° C. for 5 hours. This reaction mixture was diluted with 100 g of aqueous NaCl solution and the excess potassium hydroxide and by-product salt were removed by phase separation to provide 147 g of an addition product of allyl alcohol with ethylene oxide.

2. Synthesis of a terminal propenyl ether group-containing (poly)ether oligomer

To 46.3 g (0.5 mol) of epichlorohydrin under cooling was added 0.093 g of boron trifluoride etherate as catalyst dropwise and the reaction was conducted at 40° C. for 2 hours. This reaction product was neutralized with sodium hydroxide and washed with water to provide 46.0 g of a yellow clear polyepichlorohydrin. This polyepichlorohydrin had a GPC number-average molecular weight of 650 and a viscosity of 5.9 poises (25° C.). While 46.0 g of the above polyepichlorohydrin was heated at 80° C. with stirring, 33.6 g of KOH, 9.67 g of n-tetrabutylammonium bromide, and 40 g of toluene were added. Then, 113.4 g (0.6 mol) of the addition product of allyl alcohol with ethylene oxide was added gradually dropwise for 1 hour at 80° C. and the mixture was further allowed to stand for 5 hours, then heated at 170° C. for 3 hours to conduct rearrangement reaction. This reaction mixture was diluted with 200 g of water and the excess alkali, by-product salt, and excess addition product of allyl alcohol with ethylene oxide were removed by phase separation. From the organic phase, toluene was distilled off under 100 mmHg at 50° C. to provide 127.5 g of a terminal propenyl ether group-containing (poly)ether oligomer [hereinafter referred to as compound (13)] as Compound (A). This compound was identified by $^1$H-NMR and $^{13}$C-NMR spectrometric analyses.

Example of Synthesis-14

1. Synthesis of an addition product of 2-hydroxyethyl acrylate with ethylene oxide An SUS autoclave was charged with 116.1 g (1.0 mol) of 2-hydroxyethyl acrylate and 5.8 g of KOH, and with 132.2 g (3.0 mol) of ethylene oxide being dripped from a tap funnel, the reaction was conducted at 170° C. for 5 hours. This reaction mixture was diluted with 100 g of aqueous NaCl solution and the excess potassium hydroxide and by-product salt were removed by phase separation to provide 193.6 g of an addition product of 2-hydroxyethyl acrylate with ethylene oxide.

2. Synthesis of a terminal propenyl ether group-containing (poly)ether oligomer

After 29.0 g of methyl ethyl ketone was heated to 80° C., a diluted mixture of 124.2 g (0.5 mol) of the addition product of 2-hydroxyethyl acrylate with ethylene oxide and 0.58 g of azobisisobutyronitrile in 29.0 g of methyl ethyl ketone was added dropwise for 2 hours at 80° C. and the reaction was continued for 3 hours. The number-average molecular weight of the resulting poly(addition product of 2-hydroxyethyl acrylate with ethylene oxide) was 2500. In an autoclave, 100 g of this solution of poly(addition product of 2-hydroxyethyl acrylate with ethylene oxide) was heated at 80° C. with stirring and 33.6 g of KOH and 9.67 g of n-tetrabutylammonium bromide were added. Then, 46.0 g (0.6 mol) of allyl chloride was added gradually dropwise for 1 hour at 80° C. and the reaction was conducted for 5 hours. This reaction mixture was diluted with 200 g of water and the excess alkali and by-product salt were removed by phase separation. The unreacted allyl chloride and methyl ethyl ketone were removed from the organic phase under 100 mmHg at 50° C. and the residue was transferred to an eggplant type glass flask. Then, 32.4 g of potassium t-butoxide as catalyst and 50 g of dimethyl sulfoxide as reaction solvent were added and the reaction was conducted at 90° C. for 15 minutes (rearrangement reaction). This reaction mixture was diluted with 200 g of water and the excess alkali was removed by phase separation. From the organic phase, dimethyl sulfoxide was removed under 10 mmHg at 80° C. to provide 360.5 g of a terminal propenyl ether group-containing (poly)ether oligomer (hereinafter referred to as compound (14)] as Compound (A). This compound was identified by $^1$H-NMR and $^{13}$C-NMR spectrometric analysis.

Examples 11 to 14 and Comparative Examples 7 to 9

According to the recipes (parts by weight) shown in Table 5, the respective components were mixed and dissolved to provide photocurable resin compositions of the present invention. Using a bar coater, each composition was coated in a thickness of 20 μm on a copper plate and irradiated using an ultraviolet irradiator (one 80 W/cm high-pressure mercury-vapor lamp) at a distance of 10 cm and an irradiation intensity of 160 mw/cm$^2$ to determine the tack-free minimum energy. For evaluation of adhesion (to copper) and surface hardness, the coat was cured with an irradiation energy of 500 mJ/cm$^2$ (other conditions were as described hereinbefore) and assessed according to the methods as described in Examples 6 to 10. The results are set forth in Table 6.

TABLE 5

| | | Example | | | | Comparative Example | | |
|---|---|---|---|---|---|---|---|---|
| | | 11 | 12 | 13 | 14 | 7 | 8 | 9 |
| parts by weight | Coumpound (11) | 80 | — | — | — | — | — | — |
| | Coumpound (12) | — | 80 | — | — | — | — | — |
| | Coumpound (13) | — | — | 80 | — | — | — | — |
| | Coumpound (14) | — | — | — | 80 | — | — | — |
| | Propenyl ether-terminated compound (iii) | 20 | 20 | 20 | 20 | — | — | — |
| | Acrylate-containing compound (iv) | — | — | — | — | 100 | — | — |
| | Epoxy-containing compound (v) | — | — | — | — | — | 100 | — |
| | Alicyclic epoxy-containing compound (vi) | — | — | — | — | — | — | 100 |
| | UVR-6974 (*2) | 5 | 5 | 5 | 5 | — | 5 | 5 |
| | Irgacure 184 (*4) | — | — | — | — | 5 | — | — |

TABLE 6

| | Example | | | | Comparative Example | | |
|---|---|---|---|---|---|---|---|
| | 11 | 12 | 13 | 14 | 7 | 8 | 9 |
| Tack-free minimum energy (mJ/cm$^2$) | 30 | 35 | 20 | 45 | 800 | 850 | 900 |
| Adhesion to copper | ☉ | ☉ | ☉ | ☉ | x | x | ☉ |
| Pensil hardness | H | 2H | H | 2H | B | B | H |

Synthesis of Compound A

Example of Synthesis-15

First, 172.1 g (1.0 mol) of dimethyl adipate, 145.3 g (1.1 mol) of glycerol monoallyl ether, and, as a catalyst, 0.3 g of tetrabutoxy titanate were admixed and conducted to esterification reaction at 200° C. for 2 hours. Then, 0.3 g of tris(triphenylphosphine)ruthenium (II) chloride was added to the above reaction mixture and the rearrangement reaction was conducted at 130° C. for 5 hours to provide 299.4 g of a polyester oligomer containing a propenyl ether group in its side chains [hereinafter referred to as compound (15)] as Compound (A).

Example of Synthesis-16

1. Synthesis of an hydroxyl-containing propenyl ether

An autoclave was charged with 57.1 g (1.0 mol) of allyl alcohol and 0.5 g of KOH, and with 132.1 g (3.0 mol) of ethylene oxide being dripped from a pressure-resistant tap funnel, the reaction was conducted at 110° C. for 5 hours. Then, 0.5 g of KOH was further added and the rearrangement reaction was conducted at 160° C. for 5 hours. This reaction mixture was diluted with 200 g of water and the excess alkali was removed by phase separation to provide 151.3 g of a hydroxyl-containing propenyl ether.

2. Synthesis of a terminal propenyl ether group-containing polyester oligomer

An autoclave was charged with 730.5 g (5.0 mol) of adipic acid, 600.9 g (4.0 mol) of triethylene glycol, and, as catalyst, 0.3 g of tetrabutoxy titanate and the reaction was conducted at 200° C. for 2 hours. Then, 56.9 g of the hydroxyl-containing propenyl ether was added and the mixture was reacted at 200° C. for 3 hours. Then, 500 g of toluene was further added and the mixture was reprecipitated in methanol to provide 970.5 g of a terminal propenyl ether group-containing polyester oligomer [hereinafter referred to as compound (16)] as Compound (A).

Example of Synthesis-17

An autoclave was charged with 75.7 g of the hydroxyl-containing propenyl ether mentioned in Example of Synthesis-16, 76.4 g of pyromellitic anhydride, and, as catalyst, 0.1 g of tetrabutoxy titanate and the reaction was carried out at 200° C. for 2 hours. This reaction mixture was washed with 200 g of water and allowed to subject to phase separation, whereupon 115.2 g of a terminal propenyl ether group-containg compound [hereinafter referred to as compound (17)] was obtained as Compound (A).

Example of Synthesis-18

An SUS-autoclave was charged with 44 g (0.71 mol) of ethylene glycol and 0.5 g of KOH, and a mixture of 220 g (5.0 mol) of ethylene oxide and 505 g (5.0 mol) of allyl glycidyl ether was added thereto dropwise via a pressure-resistant tap funnel, and the reaction was conducted at 110° C. for 5 hours. Then, 0.5 g of KOH was further added and the rearrangement reaction was conducted at 160° C. for 5 hours. This reaction mixture was diluted with toluene and water and the excess alkali was removed by phase separation. From the organic phase, toluene was removed under reduced pressure to provide 769 g of a polyether diol having a hydroxyl value of 145.5 [hereinafter referred to as compound (18)] having terminal propenyl ether groups at its side chains. This compound was identified by $^1$H-NMR and $^{13}$C-NMR spectrometric analyses.

Example of Synthesis-19

An SUS-autoclave was charged with 100 g of methyl ethyl ketone, 308.4 g (0.4 mol) of compound (18) obtained in Example of Synthesis-18, 66.6 g (0.3 mol) of isophorone diisocyanate, and 0.1 g of dibutyltin dilaurate as a catalyst, and the reaction was conducted at 110° C. for 5 hours. Methyl ethyl ketone was removed under reduced pressure to provide 375 g of a polyurethane oligomer [hereinafter referred to as compound (19)] having terminal propenyl ether groups at its side chains. The compound had a GPC number-average molecular weight of 4000.

Example of Synthesis-20

An SUS-autoclave was charged with 679.6 g of novolac resin (benzene nucleus number; 8) and 3.8 g of KOH, and after melting at 130° C., 316.7 g of ethylene oxide was added thereto, and the reaction was conducted at 130° C. for 9 hours to obtain addition product of novolac resin with ethlene oxide (added on the average one mole per phenolic hydroxyl group). The addition reaction rate of ethylene oxide calculated from hydroxyl value is 98%. Then, 200 g of addition product of novolac resin with ethlene oxide obtained was dissolved in 400 g of dimethoxydiethylene glycol, 64.9 g of sodium hydroxide and 124.1 g of allyl chloride were added, and the reaction was conducted at 90° C. for 7 hours. Then, unreacted allyl chrolide was removed under reduced pressure at 50° C. The rate of allyl etherification is 95%. To 50 g of allyl ether compound, 50 g of dimethoxydiethylene glycol and 10.3 g of KOH were added, the rearrangement reaction was conducted at 150° C. for 5 hours. After the reaction, dimethoxydiethylene glycol was removed under 50 mmHg at 100° C. This reaction mixture was diluted with 50 g of toluene and 50 g of water, and the excess alkali was removed by phase separation, whereupon 49 g of a terminal propenyl ether group-containing novolac resin [hereinafter referred to as compound (20)] was obtained as Compound (A).

Examples 15 to 20 and Comparative Examples 10 to 12

According to the recipes (parts by weight) shown in Table 7, the respective components were mixed and dissolved to provide photocurable resin compositions of the present invention. Using a bar coater, each composition was coated in a thickness of 20 μm on a copper plate and irradiated using an ultraviolet irradiator (one 80 W/cm high-pressure mercury-vapor lamp) at a distance of 10 cm and an irradiation intensity of 160 mW/cm$^2$ to determine the tack-free minimum energy. For evaluation of adhesion (to copper) and surface hardness, the film was cured with an irradiation energy of 500 mJ/cm$^2$ (other conditions were as described hereinbefore) and assessed according to the methods of Examples 6 to 10. The results are set forth in Table 8.

TABLE 7

| | | Example | | | | | | Comparative Example | | |
|---|---|---|---|---|---|---|---|---|---|---|
| | | 15 | 16 | 17 | 18 | 19 | 20 | 10 | 11 | 12 |
| parts by weight | Coumpound (15) | 80 | — | — | — | — | — | — | — | — |
| | Coumpound (16) | — | 80 | — | — | — | — | — | — | — |
| | Coumpound (17) | — | — | 80 | — | — | — | — | — | — |
| | Coumpound (18) | — | — | — | 80 | — | — | — | — | — |
| | Coumpound (19) | — | — | — | — | 80 | — | — | — | — |
| | Coumpound (20) | — | — | — | — | — | 80 | — | — | — |
| | Propenyl ether-containing compound (vii) | 15 | 15 | 15 | 15 | 15 | 15 | — | — | — |
| | Acrylate-containing compound (vi) | — | — | — | — | — | — | 95 | — | — |
| | Epoxy-containing compound (v) | — | — | — | — | — | — | — | 95 | — |
| | Alicyclic epoxy-containing compound (vi) | — | — | — | — | — | — | — | — | 95 |
| | UVR-6974 (*2) | 5 | 5 | 5 | 5 | 5 | 5 | — | 5 | 5 |
| | Irgacure 184 (*4) | — | — | — | — | — | — | 5 | — | — |

The particulars of the compounds shown are as follows.
Propenyl ether-containing compound (vii): the hydroxyl-containing propenyl ether mentioned in Example of Synthesis-16

TABLE 8

| | Example | | | | | | Comparative Example | | |
|---|---|---|---|---|---|---|---|---|---|
| | 15 | 16 | 17 | 18 | 19 | 20 | 10 | 11 | 12 |
| Tack-free minimum energy (mJ/cm$^2$) | 32 | 40 | 38 | 50 | 35 | 50 | 700 | 850 | 870 |
| Adhesion to copper | ⊙ | ⊙ | ⊙ | ⊙ | ⊙ | ⊙ | X | X | ⊙ |
| Pensil hardness | H | 2H | 3H | 2H | 4H | 5H | B | B | H |

Synthesis of Compound A

Example of Synthesis-21

1. Synthesis of a hydroxyl-containing propenyl ether

An autoclave was charged with 57.1 g (140 mol) of allyl alcohol and 0.5 g of KOH, and with 132.1 g (3.0 mol) of ethylene oxide being added from a pressure-resistant tap funnel, the mixture was allowed to stand 110° C. for 5 hours. Then, 0.5 g of KOH was further added and the rearrangement reaction was conducted at 160° C. for 5 hours. This reaction mixture was diluted with 200 g of water and the excess alkali was removed by phase separation to provide 151.3 g of an hydroxyl-containing propenyl ether.

2. Synthesis of a propenyl ether- and acryloyl-containing compound

An autoclave was charged with 90.1 g of the hydroxyl-containing propenyl ether, 50.5 g of acrylic acid, and, as catalyst, 0.1 g of tetrabutoxy titanate and the reaction was conducted at 200° C. for 2 hours. To this reaction mixture were added 100 g of water and 8 g of sodium hydroxide and the excess acrylic acid was removed by phase separation, whereupon 181.1 g of a propenyl ether- and acryloyl-containing compound [whereinafter referred to as compound (21)] was obtained as Compound (A). This compound was identified by $^1$H-NMR and $^{13}$C-NMR spectrometric analyses.

Example of Synthesis-22

An autoclave was charged with 90.1 g of the hydroxyl-containing propenyl ether mentioned in Example of Synthesis-21, 146.14 g of adipic acid and, as catalyst, 0.1 g of tetrabutoxy titanate and the reaction was carried out at 200° C. for 2 hours. Then, 100 g of water and 20 g of sodium hydroxide were added and the excess adipic acid was removed by phase separation to give 180.5 g of a terminal propenyl ether group-containing carboxylic acid. Another autoclave was charged with 180.5 g of the above-mentioned terminal propenyl ether group-containing carboxylic acid and 58.7 g of 2-hydroxyethyl acrylate, and after addition of 0.1 g of tetrabutoxy titanate, the mixture was reacted at 200° C. for 2 hours. This reaction-mixture was washed with 100 g of water and the excess 2-hydroxyethyl acrylate was removed by phase separation to provide 191.5 g of a propenyl ether- and acryloyl-containing compound [hereinafter referred to as compound (22)] as Compound (A). This compound was identified by $^1$H-NMR and $^{13}$C-NMR spectrometric analyses.

Example of Synthesis-23

An autoclave was charged with 87.1 g (0.5 mol) of toluene diisocyanate and 200 g of toluene and the temperature was elevated to 60° C. Then, 90.1 g of the hydroxyl-containing propenyl ether mentioned in Example of Synthesis-21 was added dropwise for 5 hours at 60° C. and the mixture was further allowed to stand for 2 hours. Then, after the temperature was elevated to 80° C., 58.7 g (0.5 mol) of 2-hydroxyethyl acrylate was added dropwise for 30 minutes and the reaction was conducted for 1 hour. The toluene was then distilled off under 100 mmHg to provide 188.7 g of a propenyl ether- and acryloyl-containing compound [hereinafter referred to as compound (23)] as Compound (A). This compound was identified by $^1$H-NMR and $^{13}$C-NMR spectrometric analyses.

Example of Synthesis-24

A glass reaction vessel equipped with a stirrer and a thermometer was charged with 558.1 g (1.0 mol) of a glycidyl ether of an addition product of allyl alcohol with 10 moles of ethylene oxide and 0.3 g of tris(triphenyl phosphine)ruthenium (II) chloride and the rearrangement reaction was conducted at 130° C. for 5 hours to obtain a terminal propenyl ether group-containing poly(oxyethylene) glycidyl ether. To this, 72.2 g (1.0 mol) of acrylic acid was added, and the reaction was conducted at 100° C. for 8 hours to provide 630.3 g of a terminal propenyl ether group- and terminal acryloyl group-containing oligomer [hereinafter referred to as compound (24)] as Compound (A). This compound was identified by $^1$H-NMR and $^{13}$C-NMR spectrometric analyses.

Examples 21 to 24 and Comparative Examples 13 to 15

According to the recipes (parts by weight) shown in Table 9, the respective components were mixed and dissolved to provide photocurable resin compositions of the present invention. Using a bar coater, each composition was coated in a thickness of 20 μm on a copper plate and irradiated with an ultraviolet irradiator (one 80 W/cm high-pressure mercury-vapor lamp) at a distance of 10 cm and an irradiation intensity of 160 mW/cm$^2$ to determine the tack-free minimum energy. For evaluation of adhesion (to copper) and surface hardness, the film was cured with an irradiation energy of 500 mJ/cm$^2$ (other conditions were as described hereinbefore) and assessed according to the methods described in Examples 6 to 10. The results are set forth in Table 10.

TABLE 9

|  |  | Example | | | | Comparative Example | | |
|---|---|---|---|---|---|---|---|---|
|  |  | 21 | 22 | 23 | 24 | 13 | 14 | 15 |
| parts by weight | Coumpound (21) | 90 | — | — | — | — | — | — |
|  | Coumpound (22) | — | 90 | — | — | — | — | — |
|  | Coumpound (23) | — | — | 90 | — | — | — | — |
|  | Coumpound (24) | — | — | — | 90 | — | — | — |
|  | Acrylate-containing compound (iv) | — | — | — | — | 95 | — | — |
|  | Epoxy-containing compound (v) | — | — | — | — | — | 95 | — |
|  | Alicyclic epoxy-containing compound (vi) | — | — | — | — | — | — | 95 |
|  | UVR-6974 (*2) | 5 | 5 | 5 | 5 | — | 5 | 5 |
|  | Irgacure 184 (*4) | 5 | 5 | 5 | 5 | 5 | — | — |

TABLE 10

|  | Example | | | | Comparative Example | | |
|---|---|---|---|---|---|---|---|
|  | 21 | 22 | 23 | 24 | 13 | 14 | 15 |
| Tack-free minimum energy (mJ/cm$^2$) | 35 | 45 | 50 | 35 | 700 | 850 | 870 |
| Adhesion to copper | ⊚ | ⊚ | ⊚ | ⊚ | X | X | ⊚ |
| Pensil hardness | H | 2H | 3H | 2H | B | B | H |

We claim:

1. A photocurable resin composition characterized by comprising a propenyl ether group-containing compound (A) having at least ten propenyl ether groups of the following formula (1) and having a number-average molecular weight of not less than 1000, and a cationic photopolymerization initiator (B), said propenyl ether group-containing compound (A) being a compound having a backbone chain selected from the group consisting of polyether, polyvinyl, polyurethane, polyamide and novolac chains $$CH_3-CH=CH-O- \qquad (1).$$

2. The photocurable resin composition according to claim 1 wherein said propenyl ether group-containing compound (A) is a compound having at least ten propenyl ether groups of formula (1) in its side chains.

3. The photocurable resin composition according to claim 1 wherein said propenyl ether group-containing compound (A) is a compound having the structure represented by the following general formula (2)

(2)

wherein $A^1$ represents at least one group selected from the group consisting of alkylene group which is either substituted by -X-Z or unsubstituted, arylene group, aralkylene group, haloalkylene group and a residue available on ring-opening polymerization of a glycidyl ether, and wherein at least ten of $A^1$ in general formula (2) represent groups substituted by -X-Z; "a" represents an integer whose value is within the range of 10 to 200; x represents a divalent organic group; and Z represents a propenyl ether group of the following formula (1)

$$CH_3-CH=CH-O- \qquad (1).$$

4. The photocurable resin composition according to claim 3 wherein said divalent organic group X is a hydrocarbon group which may optionally have at least one group selected from the group consisting of ether, carbonate, ester, imino, amido, urethane, urea and sulfide groups.

5. The photocurable resin composition according to claim 3 wherein said propenyl ether group-containing compound (A) is a compound having propenyl ether groups of the following formula (1) at both termini of the backbone chain represented by the general formula (2)

$$CH_3-CH=CH-O- \qquad (1).$$

6. The photocurable resin composition according to claim 1 wherein said propenyl ether group-containing compound (A) is a compound having the structure represented by the following general formula (3)

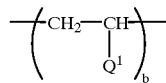
(3)

wherein $Q^1$ represents at least one group selected from the group consisting of hydrogen atom, hydroxy group, alkyl group, aryl group, haloalkyl group, haloaryl group, alkoxycarbonyl group, acetoxy group and -X-Z; and wherein at least ten of $Q^1$ in general formula (3) represent groups substituted by -X-Z; "b" represents an integer whose value is within the range of 10 to 200; and X represents a divalent organic group; and Z represents a propenyl ether group of the following formula (1)

$$CH_3-CH=CH-O- \qquad (1).$$

7. The photocurable resin composition according to claim 6 wherein said divalent organic group X is a hydrocarbon group which may optionally have at least one group selected from the group consisting of ether, carbonate, ester, imino, amido, urethane, urea and sulfide groups.

8. The photocurable resin composition according to claim 6 wherein said propenyl ether group-containing compound (A) is a compound having propenyl ether groups of the following formula (1) at both termini of the backbone chain represented by the general formulae (3)

$$CH_3-CH=CH-O- \qquad (1).$$

9. The photocurable resin composition according to claim 1 wherein said propenyl ether group-containing compound (A) is a compound, having the structure represented by the following general formula (6)

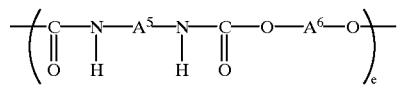
(6)

wherein $A^5$ represents a residue available on elimination of isocyanate groups from a diisocyanate; $A^6$ represents a residue available from an alkylene diol which is either substituted by -X-Z or unsubstituted, a residue available from an arylene diol which is either substituted by -X-Z or unsubstituted, a residue available from a (poly) ether diol which is either substituted by -X-Z or unsubstituted, or a residue available from a polyester diol which is either substituted by -X-Z or unsubstituted; and wherein at least ten of $A^5$ and $A^6$ in general formula (6) represent groups substituted by -X-Z; "e" represents an integer whose value is within the range of 10 to 200; X represents a divalent organic group; and Z represents a propenyl ether group of the following formula (1)

$$CH_3-CH=CH-O- \qquad (1).$$

10. The photocurable resin composition according to claim 9 wherein said divalent organic group X is a hydrocarbon group which may optionally have at least one group selected from the group consisting of ether, carbonate, ester, imino, amido, urethane, urea and sulfide groups.

11. The photocurable resin composition according to claim 9 herein said propenyl ether group-containing compound (A) is a compound having propenyl ether groups of the following formula (1) at both termini of the backbone chain represented by the general formula (6)

$$CH_3-CH=CH-O- \qquad (1).$$

12. The photocurable resin composition according to claim 1 wherein said propenyl ether group-containing compound (A) is a compound having the structure represented by any of the following general formulae (7) and (8)

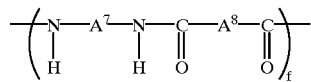
(7)

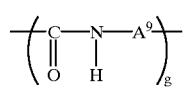
(8)

wherein in formula (7), $A^7$ and $A^8$ may be the same or different and each represents alkylene group which is either substituted by -X-Z or unsubstituted, arylene group which is either substituted by -X-Z or unsubstituted, aralkylene group, or haloalkylene group; and wherein at least ten of $A^7$ and $A^8$ in general formula (7) represent groups substituted by -X-Z; "f" represents an integer whose value is within the range of 5 to 200;

wherein in formula (8), $A^9$ represents alkylene group which is either substituted by -X-Z or unsubstituted, arylene group which is either substituted by -X-Z or unsubstituted, aralkylene group, or haloalkylene group; and wherein at least ten of $A^9$ in general formula (8) represent groups substituted by -X-Z; "g" represents an integer whose value is within the range of 10 to 200; X represents a divalent organic group; and Z represents a propenyl ether group of the following formula (1)

$$CH_3\text{—}CH\text{=}CH\text{—}O\text{—} \tag{1}$$

13. The photocurable resin composition according to claim 12 wherein said divalent organic group X is a hydrocarbon group which may optionally have at least one group selected from the group consisting of ether, carbonate, ester, imino, amido, urethane, urea and sulfide groups.

14. The photocurable resin composition according to claim 12 wherein said propenyl ether group-containing compound (A) is a compound having propenyl ether groups of the following formulae (1) at both termini of the backbone chain represented by the general formula (7) and (8)

$$CH_3\text{—}CH\text{=}CH\text{—}O\text{—} \tag{1}$$

15. The photocurable resin composition according to claim 1 wherein said propenyl ether group-containing compound (A) is a compound having the structure represented by the following general formula (10)

(10)

wherein Ar represents aryl group, $Q^2$ represents at least one group selected from the group consisting of hydrogen atom, glycidyl group and -X-Z; and wherein at least ten of $Q^2$ in general formula (10) represent -X-Z; "i" represents an integer whose value is within the range of 10 to 200; X represents a divalent organic group; and Z represents a propenyl ether group of the following formula (1)

$$CH_3\text{—}CH\text{=}CH\text{—}O\text{—} \tag{1}$$

16. The photocurable resin composition according to claim 15 herein said divalent organic group x is a hydrocarbon group which may optionally have at least one group selected from the group consisting of ether, carbonate, ester, imino, amido, urethane, urea and sulfide groups.

17. The photocurable resin composition according to claim 15 herein said propenyl ether group-containing compound (A) is a compound having propenyl ether groups of the following formula (1) at both termini of the backbone chain represented by the general formula (10)

$$CH_3\text{—}CH\text{=}CH\text{—}O\text{—} \tag{1}$$

18. The photocurable resin composition according to claim 1 wherein said cationic photopolymerization initiator (B) is an onium salt.

19. The photocurable resin composition according to claim 18 wherein said cationic photopolymerization initiator (B) is at least one species selected from the group consisting of triarylsulfonium salts and diaryliodonium salts.

20. The photocurable resin composition according to claim 1 wherein the weight ratio of propenyl ether group-containing compound (A) to cationic photopolymerization initiator (B) is 95:5 through 99.9:0.01.

21. The photocurable resin composition according to claim 1 which further contains a radical polymerizable vinyl compound (D) and a photoradical polymerization initiator (E).

22. A cured artefact obtained by photocuring of the photocurable resin composition of claim 1.

23. The cured artefact according to claim 22 which is obtained by photocuring of the photocurable resin composition of claim 15.

24. A photoresist for printed circuit board, printing ink, paint, paper coating, metal coating, optical fiber coating, hard coating, or adhesive containing the photocurable resin composition of claim 1.

25. The photoresist according to claim 24 which contains the photocurable resin composition of claim 15.

26. A photocurable resin composition characterized by comprising:

a propenyl ether group-containing compound (A) having at least five propenyl ether groups of the following formula (1) and having a number-average molecular weight of not less than 500, a cationic photopolymerization initiator (B); and a reactive diluent (C) comprising a compound of the following general formula (11) and having a molecular weight of less than 500;

wherein a proportion of said reactive diluent (C) is 5 to 60 weight % relative to the combined weight of said propenyl ether group-containing compound (A) and cationic photopolymerization initiator (B)

$$CH_3\text{—}CH\text{=}CH\text{—}O\text{—} \tag{1}$$

$$CH_3\text{—}CH\text{=}CH\text{—}O\text{—}R^1\text{—}O\text{—}R^2 \tag{11}$$

wherein in formula (11), $R^1$ represents a residue available on elimination of hydroxyl groups from an alkylene diol, arylene diol, polyether diol or polyester diol of the formula $HO\text{—}R^1\text{—}OH$; and $R^2$ represents alkyl group, aryl group, aralkyl group, cycloalkyl group or hydrogen atom.

27. The photocurable resin composition according to claim 25 wherein said propenyl ether group-containing compound (A) has at least ten propenyl ether groups of formula (1) and has a number-average molecular weight of not less than 1000.

28. The photocurable resin composition according to claim 25 wherein said propenyl ether group-containing compound (A) is a compound having a backbone chain selected from the group consisting of polyether, polyvinyl, polyester, polyurethane, polyamide, polycarbonate and novolac chains.

* * * * *